United States Patent
Ammo et al.

(10) Patent No.: US 6,548,873 B2
(45) Date of Patent: *Apr. 15, 2003

(54) SEMICONDUCTOR DEVICE AND MANUFACTURING METHOD OF THE SAME

(75) Inventors: Hiroaki Ammo, Kanagawa (JP); Hiroyuki Miwa, Kanagawa (JP); Shigeru Kanematsu, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/416,259

(22) Filed: Oct. 12, 1999

(65) Prior Publication Data

US 2002/0033509 A1 Mar. 21, 2002

(30) Foreign Application Priority Data

Oct. 12, 1998 (JP) ............................................. 10-288984

(51) Int. Cl.$^7$ ............................................... H01L 29/76
(52) U.S. Cl. ........................ 257/370; 257/378; 257/640; 257/641; 257/649; 257/650
(58) Field of Search ................................. 257/370, 378, 257/640, 641, 649, 650

(56) References Cited

U.S. PATENT DOCUMENTS 4,984,200 A * 1/1991 Saitoo et al. ................ 365/154
5,604,371 A * 2/1997 Kimura et al. ............... 257/378

FOREIGN PATENT DOCUMENTS

| EP | 0 514 547 A1 | 11/1992 |
| EP | 0 849 792 A1 | 6/1998 |
| JP | 02032561 | 2/1990 |
| JP | 10173063 | 6/1998 |
| JP | 10189752 | 7/1998 |

\* cited by examiner

*Primary Examiner*—Wael Fahmy
*Assistant Examiner*—Wai-Sing Louie
(74) *Attorney, Agent, or Firm*—Sonnenschein, Nath & Rosenthal (57) ABSTRACT

A semiconductor device causes less element characteristic fluctuation and hardly causes parasitic actions even when a wire having a barrier metal made of a titanium material is provided. The semiconductor device includes a MOS transistor provided on the surface side of a semiconductor substrate, a first silicon oxide film, a silicon nitride film and a second silicon oxide film provided on the semiconductor substrate while covering the MOS transistor, and a wire having a barrier metal made of titanium material and provided on the insulating film, wherein the silicon nitride film covers the MOS transistor and has an opening on an element isolating region for isolating the MOS transistors. The silicon nitride film is formed in one and the same process as that of a dielectric film of a capacitor element.

13 Claims, 6 Drawing Sheets

SEMICONDUCTOR DEVICE AND MANUFACTURING METHOD OF THE SAME

RELATED APPLICATION DATA

The present application claims priority to Japanese Application No. P10-288984 filed Oct. 12, 1998 which application is incorporated herein by reference to the extent permitted by law.

BACKGROUND OF THE INVENTION

1. Field of the Invention

The present invention relates to a semiconductor device and a manufacturing method thereof and more specifically to a semiconductor device and a manufacturing method thereof which causes less characteristic fluctuation of elements and hardly causes a parasitic action even when the semiconductor device comprises a barrier metal made of a titanium material on an inter-layer insulating film.

2. Description of Related Art

Figure 1:
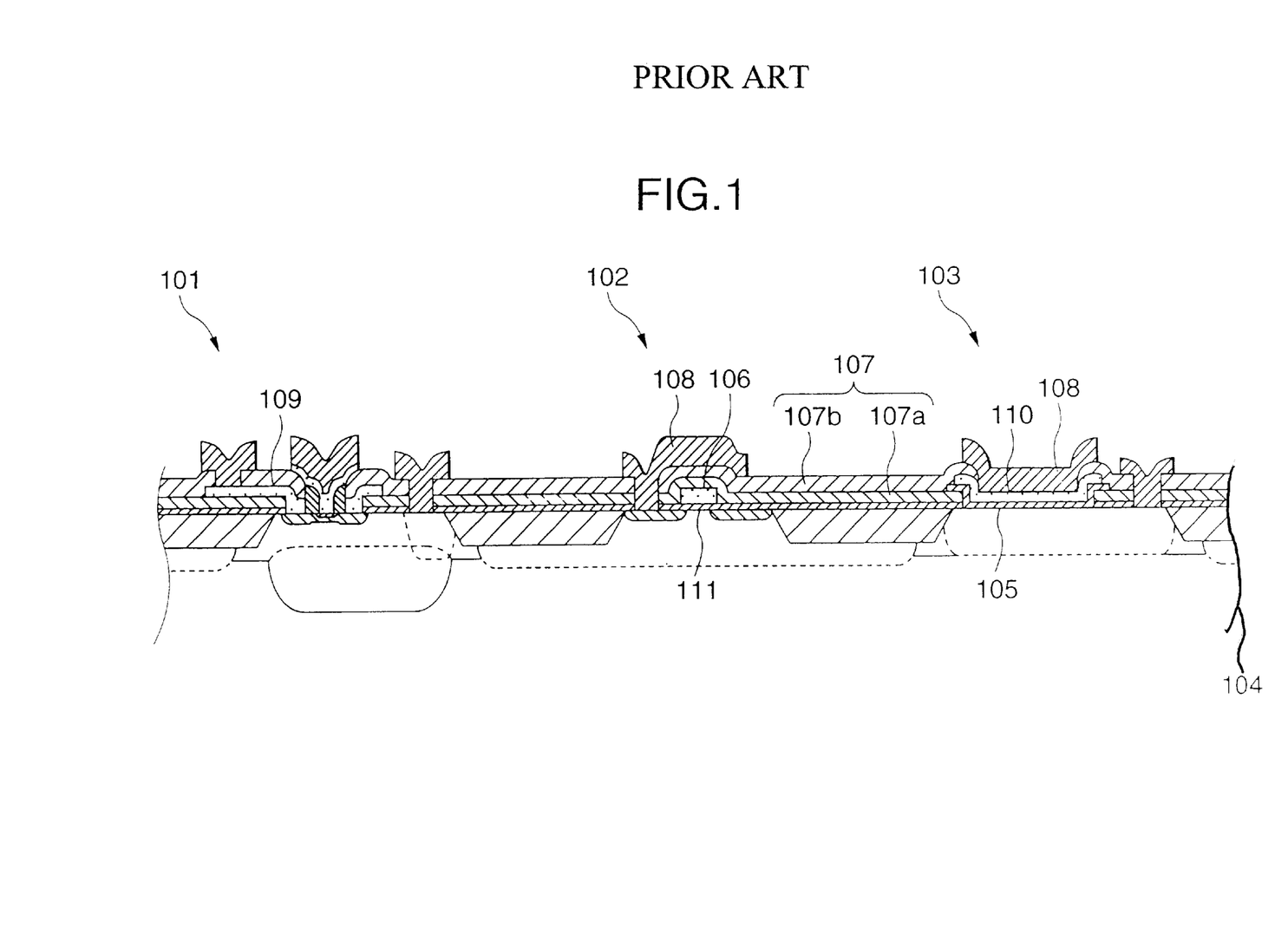
FIG. 1 is a section view showing the structure of a prior art semiconductor device.

FIG. 1 is a section view showing one structural example of a semiconductor device.

The semiconductor device shown in the figure is a so-called BiCMOS comprising a bipolar transistor 101, an N-channel type MOS (Metal Oxide Semiconductor) transistor 102, a P-channel type MOS transistor (not shown) and a MIS (Metal Insulator Semiconductor) type capacitor element 103 formed on the surface side of one and same semiconductor substrate 104. The bipolar transistor 101 is an NPN type bipolar transistor having a double poly-silicon structure suited for high speed and the MOS transistor 102 has a single drain structure. The capacitor element 103 is formed by using a silicon nitride film as a dielectric film 105.

An inter-layer insulating film 107 covering a gate electrode 106 of the MOS transistor 102 is composed of a first silicon oxide film 107a and a second silicon oxide film 107b. The first silicon oxide film 107a is a film for use as an opening of an active region of the bipolar transistor 101 and the second silicon oxide film 107b is a film formed on the first silicon oxide film 107a while covering a base electrode 109 of the bipolar transistor 101 and an upper electrode 110 of the capacitor element 103. Wires 108 are provided on the inter-layer insulating film 107 constructed as described above. Its electro-migration resistance and heat resistance are assured by constructing it by laminating, in order from the bottom, a titanium film, titanium nitride oxide film, a titanium film and silicon aluminum film.

However, the semiconductor device constructed as described above has had the following problems.

In the semiconductor device constructed as explained by using FIG. 1, the wire 108 is provided on the gate electrode 106 via the inter-layer insulating film 107 composed of the first silicon oxide film 107a and the second silicon oxide film 107b. Therefore, hydrogen which has been captured by dangling bonds at the interface between the silicon/silicon oxide film (i.e., the interface between the semiconductor substrate 104 and the gate oxide film 111) under the gate electrode 106 diffuse within the inter-layer insulating film 108 and are absorbed by the titanium film composing the wire 108 when a heating process such as a sintering process or an alloy processing for forming a titanium-gold alloy film on the back of the semiconductor substrate 104 is implemented after forming the wire 108. As a result, the dangling bonds increase at the above-mentioned interface, thus fluctuating the threshold voltage of the MOS transistor 102.

Further, moisture within the thick silicon oxide film composing the inter-layer insulating film 107 diffuses under the gate electrode 106, thus deteriorating the hot-carrier resistance of the MOS transistor 102.

Meanwhile, as the BiCMOS type semiconductor device, there is also one using an inter-layer insulating film formed by laminating a silicon oxide film on a silicon nitride film as disclosed in Japanese Patent Laid-Open No. 2-32561.

In the semiconductor device disclosed in Japanese Patent Laid-Open No. 2-32561, the upper part of a MOS transistor is covered by a silicon nitride film for preventing the diffusion of hydrogen. Therefore, it is possible to prevent the hydrogen at the above-mentioned interface between the silicon/silicon oxide film under the gate electrode 106 from diffusing by the silicon nitride film even when the above-mentioned heating process is carried out after forming the wires above the silicon nitride film. Accordingly, it enables the prevention of the dangling bonds from increasing at the abovementioned interface. Still more, because the silicon nitride film also shuts down the diffusion of moisture, it is possible to prevent the moisture within the silicon oxide film composing the inter-layer insulating film from diffusing under the gate electrode. Accordingly, it allows the hot-carrier resistance of the MOS transistor to be assured.

However, because the upper part of the bipolar transistor is also covered by the silicon nitride film in this semiconductor device, a number of dangling bonds is kept small at the interface between the silicon and the silicon oxide film in the bipolar transistor (e.g., at the interface between the semiconductor substrate and the field oxide film in the above-mentioned publication). Accordingly, the current amplification factor (hFE) of a parasitic PNP bipolar transistor composed of a base/collector/substrate in the NPN type bipolar transistor becomes high.

Further, because an element isolating region for isolating the MOS transistors is also covered by the silicon nitride film in the semiconductor device described in the above-mentioned publication, hydrogen at the interface between the field oxide film and the semiconductor substrate composing the element isolating region are assured, thus preventing the dangling bonds from increasing. Therefore, threshold voltage (Para-Vth) of the parasitic MOS transistor formed between the adjoining MOS transistors becomes small. As a result, it has had a problem that a parasitic action is liable to occur.

Accordingly, it is an object of the present invention to provide a semiconductor device, and a manufacturing method thereof, which causes less characteristic fluctuation of elements and hardly causes parasitic action even if it comprises a barrier metal composed of a titanium material on an inter-layer insulating film.

SUMMARY OF THE INVENTION

In order to achieve the above-mentioned object, an inventive semiconductor device comprises a MOS transistor provided on the surface side of a semiconductor substrate; a silicon oxide insulating film and a silicon nitride insulating film provided on the semiconductor substrate while covering the MOS transistor; and wires having a barrier metal made of a titanium material and provided above these insulating films and is characterized in that the silicon nitride insulating film covers the MOS transistor and has an opening on an element isolating region for isolating the MOS transistors.

Because the silicon nitride insulating film covering the MOS transistor becomes a barrier in the semiconductor device constructed as described above, hydrogen which has been captured by dangling bonds at the interface between the semiconductor substrate and a gate oxide film will not reach to the wires provided above the silicon nitride insulating film. Therefore, it is possible to prevent the hydrogen from being absorbed by the barrier metal made of the titanium material constituting the wire and to suppress a number of dangling bonds from increasing at the above-mentioned interface. Accordingly, the threshold voltage of the MOS transistor is stabilized.

Further, because the silicon nitride insulating film becomes the barrier, it prevents moisture above the silicon nitride insulating film from diffusing down to a gate electrode of the MOS transistor. Therefore, the hot-carrier resistance of the MOS transistor may be assured.

Still more, because the opening of the silicon nitride insulating film is provided on the element isolating region for isolating the MOS transistors, hydrogen at the interface between the silicon oxide film and the semiconductor substrate diffuses upward via the silicon oxide film when the silicon oxide film is provided in the element isolating region, thus increasing the dangling bonds at the interface. Therefore, threshold voltage (Para-Vth) of a parasitic MOS transistor formed between the adjoining MOS transistors become large. As a result, the parasitic actions of the MOS transistor hardly occurs.

When the bipolar transistor is provided on the surface side of the semiconductor substrate in the semiconductor device described above, the silicon nitride insulating film has an opening on the bipolar transistor.

Thereby, hydrogen at the interface between the semiconductor substrate and the silicon oxide insulating film in the bipolar transistor diffuses upward via the silicon oxide insulating film. Therefore, the dangling bonds increase at the interface, thus lowering a current amplification factor (hFE) of the parasitic bipolar transistor composed of a base/collector/substrate in the above-mentioned bipolar transistor.

A capacitor element comprising a dielectric film formed in the same process with that of the silicon nitride insulating film may be provided on the surface side of the semiconductor substrate in the semiconductor device. It allows the semiconductor device comprising the silicon nitride insulating film, the MOS transistor and the capacitor element to be obtained without increasing manufacturing steps.

An inventive semiconductor device manufacturing method comprises steps of forming a MOS transistor on the surface side of a semiconductor substrate; forming a silicon nitride insulating film covering the MOS transistor and having an opening on an element isolating region for isolating the MOS transistors above the semiconductor substrate; and forming a capacitor element on the surface side of the semiconductor substrate and is characterized in that it further comprises a step of forming the silicon nitride insulating film and the dielectric film of the capacitor element in the same time. In this step, an opening is created through the silicon nitride insulating film on the bipolar transistor provided on the surface side of the semiconductor substrate.

The above-mentioned semiconductor device manufacturing method allows the semiconductor device comprising the silicon nitride insulating film covering the MOS transistor together with the respective elements and having the opening on the element isolating region to be obtained with the same number of manufacturing steps with that for forming the semiconductor device comprising the MOS transistors, the capacitor element and (the bipolar transistors).

The specific nature of the invention, as well as other objects, uses and advantages thereof, will clearly appear from the following description and from the accompanying drawings in which like numerals refer to like parts.

DETAILED DESCRIPTION OF THE PREFERRED EMBODIMENTS

Embodiments to which the inventive semiconductor device and manufacturing method thereof are applied will be explained below based on the drawings.

(First Embodiment)

Figure 2:
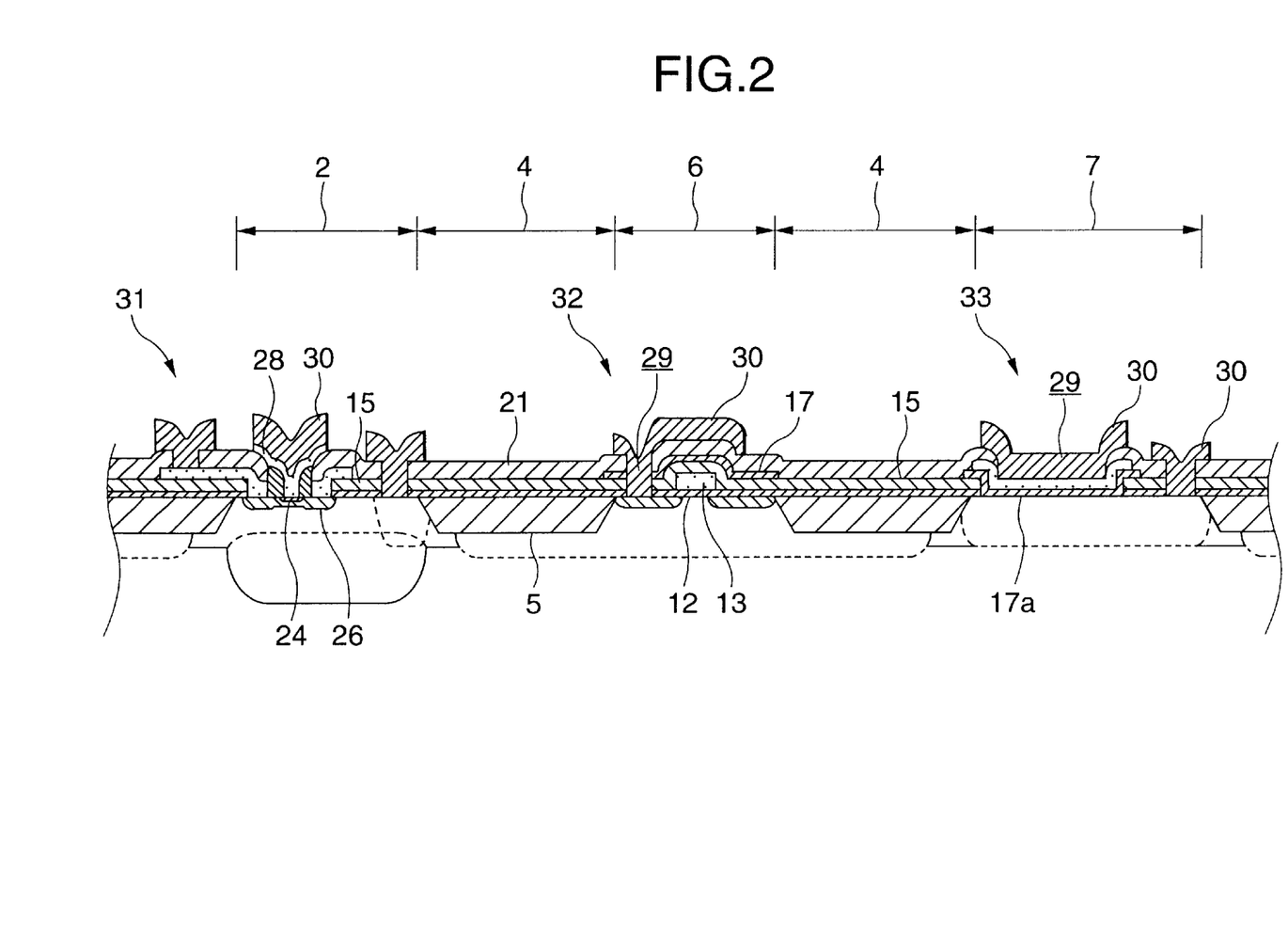
FIG. 2 is a section view showing the structure of a semiconductor device of a first embodiment.

FIG. 2 is a section view showing one structural example of the inventive semiconductor device and FIGS. 3 through 5 are sectional process drawings for explaining the manufacturing method of the semiconductor device. Here, the semiconductor device, and its manufacturing method, comprising an NPN bipolar transistor (hereinafter denoted as a bipolar Tr.), a P-channel MOS transistor and an N-channel MOS transistor (hereinafter only the N-channel MOS transistor will be typically shown and denoted as a MOS Tr.) and a capacitor element formed on one and same semiconductor substrate will be explained. The semiconductor manufacturing method will be explained at first by using FIGS. 3 through 5. It is noted that one example of processing conditions will be shown in parentheses in each process.

Figure 3A:
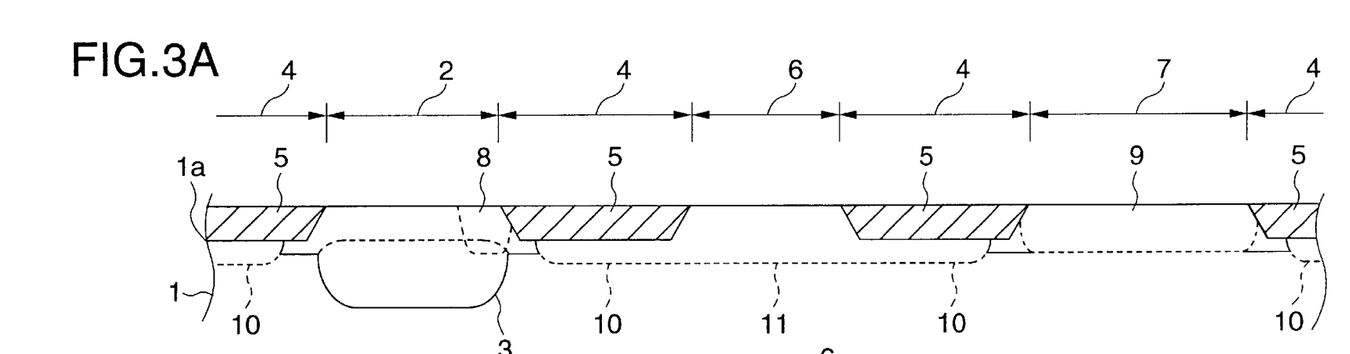
FIG. 3 is a sectional process drawing (No. 1) for explaining a manufacturing method of the semiconductor device of the first embodiment.

As shown in FIG. 3A, an N+ bulk region 3 is formed in a bipolar region 2 where the bipolar Tr, is provided on the side of the surface of a semiconductor substrate 1, made of P-type (100) silicon. Here, the N+ bulk region 3 is formed by diffusing antimony (Sb) by means of vapor phase diffusion (1200° C. for example) using antimony oxide ($Sb_2O_3$).

After that, an N-type epitaxial layer 1a is formed on the semiconductor substrate 1. This epitaxial layer 1a is formed so as to have 1 to 5 Ωcm of seat resistance and 0.7 to 2.0 μm of thickness for example. Hereinafter, the semiconductor substrate 1 and the epitaxial layer 1a are called as the semiconductor substrate 1 in combination.

Next, a silicon oxide film (so-called field oxide film) 5 is formed in an element isolating region 4 on the surface side of the semiconductor substrate 1 to divide the surface side of the semiconductor substrate 1 into the bipolar region 2, a MOS region 6 where a MOS transistor (denoted as a MOS Tr.) is formed and a MISC region 7 where a MIS type capacitor element is formed. Here, after forming an oxide film (not shown) of about 50 nm on the surface layer of the semiconductor substrate 1 by means of thermal oxidation, a silicon nitride ($Si_3N_4$) film (not shown) of around 100 nm is formed by means of CVD. Next, a resist pattern (not shown)

for opening the bipolar region 2, the MOS region 6 and the MISC region 7 is formed to remove the above-mentioned oxide film and the silicon nitride film by etching by using the resist pattern as a mask. After that, the surface layer of the semiconductor substrate 1 is etched further by about 300 to 750 nm. Next, a recessed field oxide film (hereinafter referred to as a field oxide film) 5 of 600 to 1500 nm of thickness is formed in the element isolating region 4 by means of steam oxidation (e.g., 1000 to 1050° C. and three to eight hours).

Next, after removing the silicon nitride film, the surface of the semiconductor substrate 1 is flattened. Then, a collector drawing section 8 of the NPN Tr. is formed in the bipolar region 2 and an N+ sinker 9 is formed in the MISC region 7 by ion implantation (70 keV of implanting energy and $5\times10^{15}$ /cm$^2$ of dosage for example) using phosphorus ion (P+) as implanted ion and by a heat treatment (1000° C. and 30 minutes for example) thereafter.

After that, an isolating and diffusing layer 10 is formed under the field oxide film 5 in the element isolating region 4 and a P-well region 11 is formed in the MOS region 6 by implanting ions (200 to 720 keV of implanting energy and $10^{12}$ to $5\times10^{13}$/cm$^2$ of dosage for example) of P-type impurity (boron ions for example).

Figure 3B:
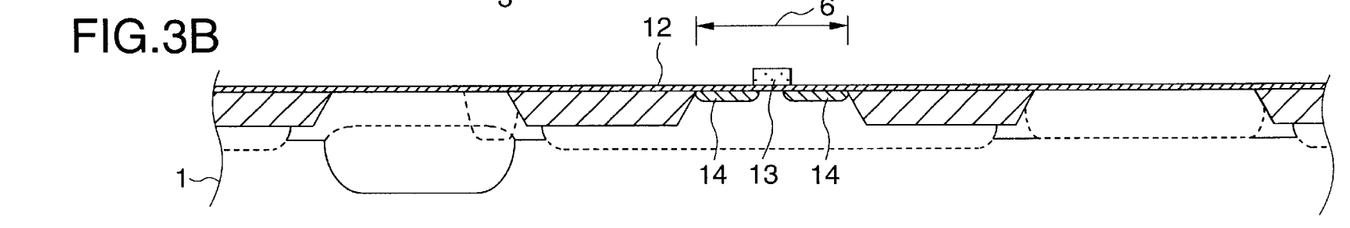

Next, a gate oxide film 12 of around 15 nm to 50 nm in thickness is formed on the semiconductor substrate 1 by thermal oxidation (850 to 950° C. for example) as shown in FIG. 3B.

After that, an N-type gate electrode 13 made of poly-silicon is formed on the gate oxide film 12 in the MOS region 6. Here, a poly-silicon film (not shown) of 150 to 300 nm in thickness is formed on the whole surface of the gate oxide film 12 by means of CVD at first. Next, an N-type impurity is introduced to a gate part of the MOS region 6 by thermal diffusion or the like from the oxide film into which impurity has been introduced. Subsequently, the poly-silicon film is patterned by etching by using a resist pattern not shown as a mask to obtain the gate electrode 13 made of this poly-silicon film. Dry etching using chloride gas (Cl$_2$), difluoromethane (CH$_2$F$_2$) and/or sulfur hexafluoride (SF$_6$) as the gas system for example is implemented in this etching.

After that, ion implantation is implemented to form an N-type source/drain region 14 in the MOS region 6.

Figure 3C:
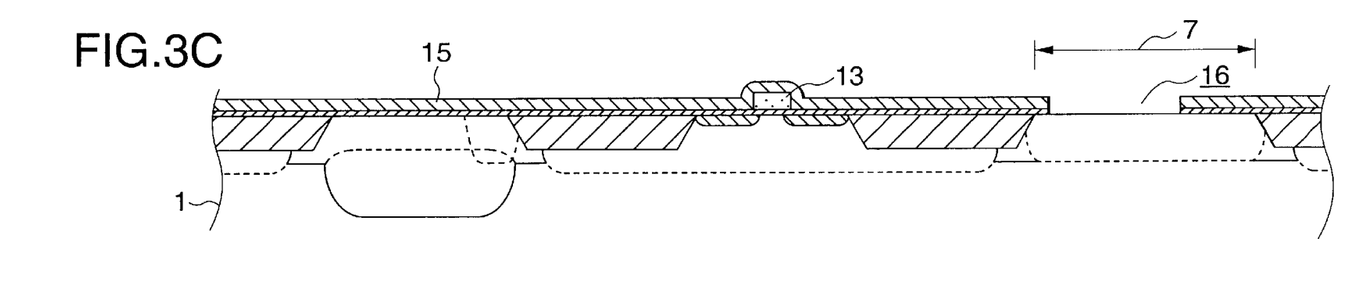

Next, a silicon oxide insulating film (here, it is a silicon oxide film for example and is denoted as a first silicon oxide film) 15 of about 200 nm thick is formed while covering the gate electrode 13 as shown in FIG. 3C. After that, the first silicon oxide film 15 is patterned by means of RIE (Reactive Ion Etching) using a resist pattern (not shown) as a mask to form a capacitor opening 16 in which the semiconductor substrate 1 is exposed at part of the MISC region 7. It is noted that a capacitor area of the capacitor element formed in the MISC region 7 is determined by an area of the semiconductor substrate 1 exposed in the MISC region 7.

Figure 4A:
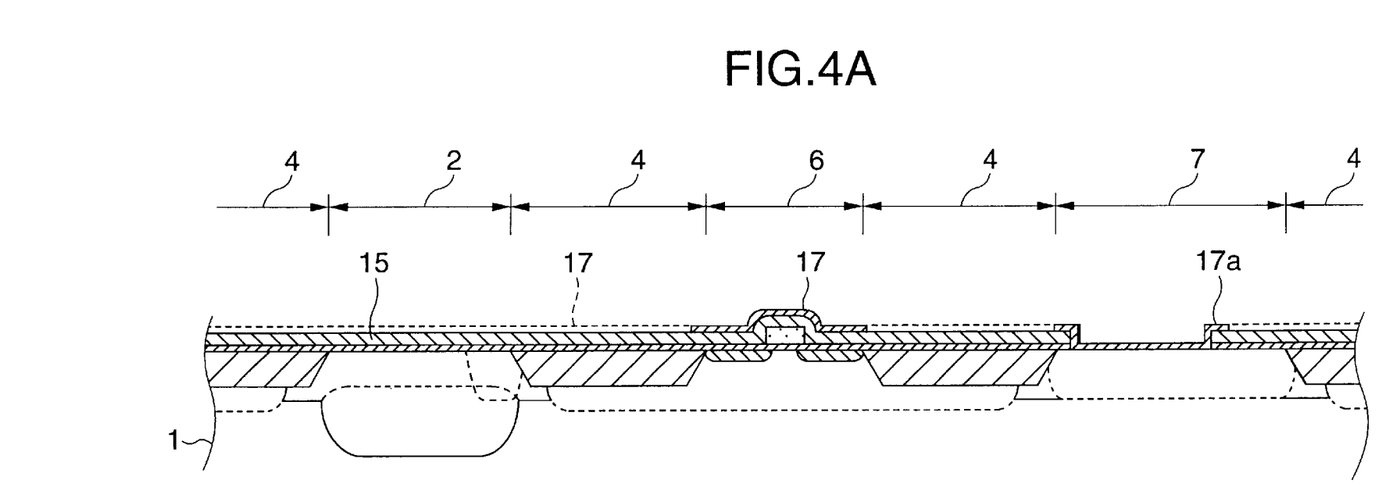
FIG. 4 is a sectional process drawing (No. 2) for explaining the manufacturing method of the semiconductor device of the first embodiment.

Next, a silicon nitride insulating film (here, it is a silicon nitride film for example and is denoted as a silicon nitride film) 17 of 20 to 60 nm thick is formed by means of low pressure CVD for example on the whole surface above the semiconductor substrate 1 as shown in FIG. 4A. The thickness of the silicon nitride film 17 is set at the thickness enough for preventing hydrogen and moisture from diffusing even when the thickness of the film is reduced in the later processing steps.

Next, the silicon nitride film 17 is removed except of that in the MOS region 6 and the MISC region 7 by RIE using a resist pattern (not shown) as a mask. Thereby, the silicon nitride film 17 covering the whole surface of the MOS region 6 and having openings on the element isolating region 4 and the bipolar region 2 is formed and a dielectric film 17a made of this silicon nitride film 17 is formed in the MISC region 7.

Figure 4B:
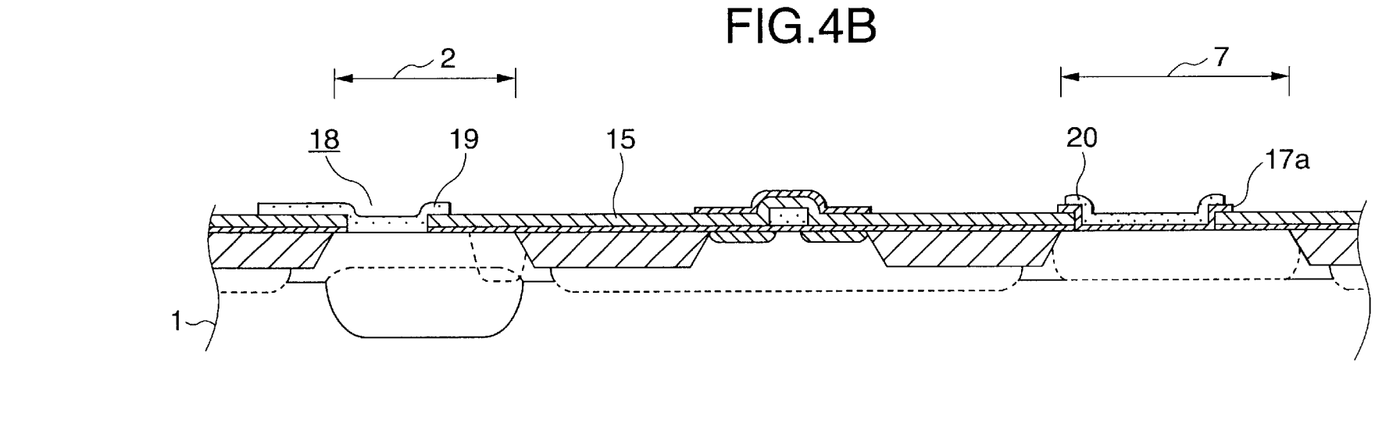

Next, the first silicon oxide film 15 on a base forming region in the bipolar region 2 is removed as shown in FIG. 4B to form a base opening 18. After that, a base electrode 19 made of poly-silicon is formed in the bipolar region 2 and an upper electrode 20 made of poly-silicon is formed on the dielectric film 17a in the MISC region 7. Here, the poly-silicon film (not shown) of 100 to 200 nm thick is formed on the whole surface above the semiconductor substrate 1 by means of CVD at first. Next, difluoroboron ion (BF$_2$+) is introduced to the poly-silicon film by means of ion implantation (30 to 50 keV of implanting energy and $10^{15}$ to $10^{16}$/cm$^2$ of dosage). After that, this poly-silicon film is patterned by RIE using the resist pattern (not shown) formed in the lithography process to obtain the base electrode 19 and the upper electrode 20 described above.

Figure 5A:
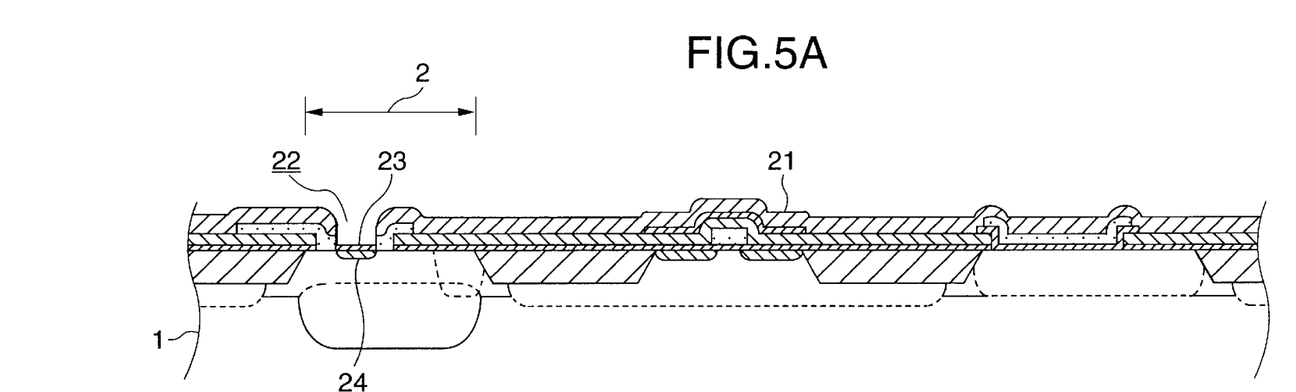
FIG. 5 is a sectional process drawing (No. 3) for explaining the manufacturing method of the semiconductor device of the first embodiment.

Next, a silicon oxide insulating film (here, it is a silicon oxide film for example and is denoted as a second silicon oxide film) 21 of 200 to 400 nm thick is formed on the whole surface above the semiconductor substrate 1 by means of CVD as shown in FIG. 5A. After that, a part of the second silicon oxide film 21 and the base electrode 19 in the bipolar region 2 are removed by RIE using the resist pattern (not shown) as a mask to form an opening 22 which reaches to the semiconductor substrate 1.

Next, a pad oxide film 23 of 5 to 15 nm thick is formed at the bottom of the opening 22 by means of pyrogenic oxidation (850° C. for example). After that, an intrinsic base region 24 is formed in the bipolar region 2 by introducing BF$_2$+ under the pad oxide film 23 by means of ion implantation (30 to 50 keV of implanting energy and $10^{13}$ to $10^{14}$/cm$^2$ of dosage).

Figure 5B:
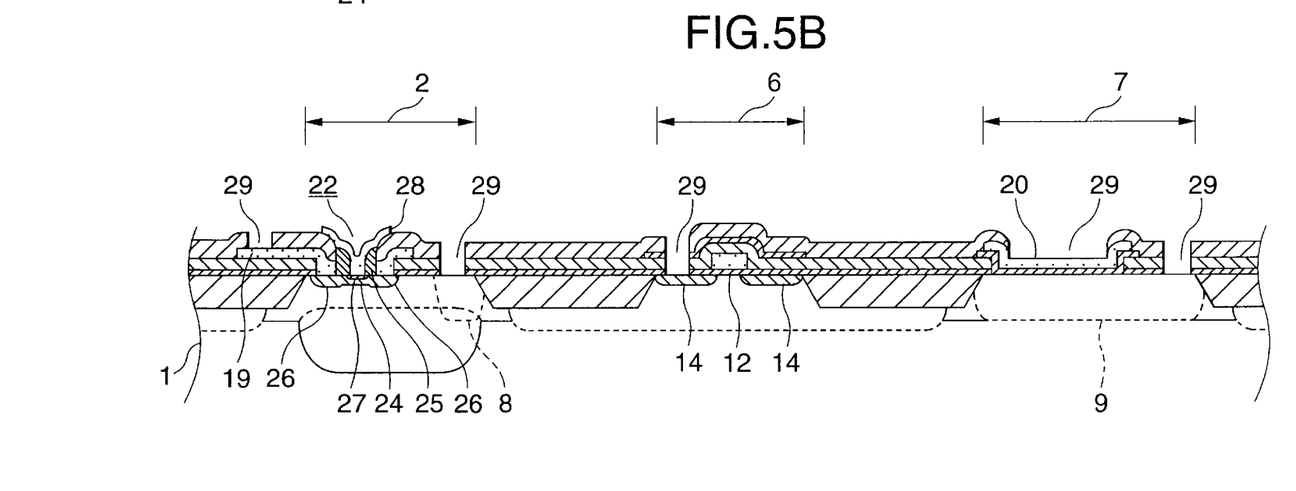

Next, an insulating side wall 25 made of silicon oxide is formed on the inner wall of the opening 22 as shown in FIG. 5B. Here, the side wall 25 is formed by forming a silicon oxide film (not shown) on the whole surface above the semiconductor substrate 1 by means of CVD and by etching back this silicon oxide film across the whole surface after implementing an annealing treatment (900° C. and 10 to 30 minutes for example). Further, P-type impurity is diffused within the semiconductor substrate 1 from the poly-silicon forming the base electrode 19 by the above-mentioned annealing to form a grafted base region 26 connected to the activated intrinsic base region 24.

After that, an emitter region 27 is formed at the bottom of the opening 22 in the bipolar region 2 and an emitter electrode 28 connected to the emitter region 27 is formed. Here, after forming a poly-silicon film (not shown) across the whole surface above the semiconductor substrate 1 by means of CVD, arsenic ion (As+) is introduced to this poly-silicon film by means of ion implantation (30 to 70 keV of implanting energy and $10^{15}$ to $10^{16}$/cm$^2$ of dosage). Next, an annealing treatment (1000 to 1100° C. and 5 to 30 seconds) is implemented to diffuse the arsenic ion introduced to the poly-silicon film to the semiconductor substrate 1 from the bottom of the opening 22 to form the emitter region 27. After that, the poly-silicon film is patterned by means of dry etching to form the emitter electrode 28 connected to the emitter region 27.

Next, respective contact holes 29 reaching to the base electrode 19 and the collector drawing section 8 in the bipolar region 2, the source/drain diffusion layer 14 in the MOS region 6, the gate electrode section not shown here, the upper electrode 20 and the N+ sinker 9 in the MISC region 7 are formed.

After that, a heat treatment (350 to 450° C. and 15 to 120 minutes) is implemented within hydrogen containing atmosphere (hydrogen gas atmosphere or forming gas atmosphere for example). It allows hydrogen to be supplied to the dangling bonds at the interface between the semiconductor substrate 1 and the gate oxide film 12 efficiently in a short time through the contact hole 29.

After that, wires 30 made of metal are formed so that they are connected to the bottom of the respective contact holes 29, the emitter electrode 28 in the bipolar region 2 and the upper electrode 17a in the MISC region 7 as shown in FIG. 2. This wire 30 is formed by laminating, in order from the bottom, titanium (Ti), titanium oxide nitride (TiON), titanium (Ti) and silicon aluminum (AlSi).

Then, although not shown here, multi-layered wires and an overcoat film are formed to form the semiconductor device on which the bipolar Tr. 31, the MOS Tr. 32 and the capacitor element 33 are provided on the side of the surface of the semiconductor substrate 1.

Because the semiconductor device shown in FIG. 2 and formed as described above is covered by the silicon nitride film 17 above the MOS region 6 thereof, the silicon nitride film 17 becomes a barrier and hydrogen which has been captured by the dangling bonds at the interface between the semiconductor substrate 1 and the gate oxide film 12 will not reach to the wire 30 provided above the silicon nitride film 17. Therefore, it becomes possible to prevent the hydrogen from being absorbed by titanium (Ti) at the bottom layer composing the wire 30 and to suppress the number of dangling bonds from increasing at the above-mentioned interface. Accordingly, it becomes possible to stabilize the threshold voltage of the MOS Tr. 32.

Further, because the silicon nitride film 17 becomes the barrier in the MOS region 6, it is possible to prevent the moisture within the second silicon oxide film 21 above the silicon nitride film 17 from diffusing down to the gate electrode 13 of the MOS Tr. 32. Therefore, it becomes possible to assure the hot-carrier resistance of the MOS Tr. 32.

It is noted that although the first silicon oxide film 15 exists under the silicon nitride film 17, the moisture content in the first silicon oxide film 15 is small and causes no problem because its thickness is thin.

Still more, because the opening of the silicon nitride film 17 is provided on the element isolating region 4, the hydrogen at the interface between the field oxide film 5 and the semiconductor substrate 1 diffuses upward via the field oxide film 5 in the element isolating region 4 and the number of dangling bonds increases at the above-mentioned interface. Therefore, although not shown here, the threshold voltage (Para-Vth) of a parasitic MOS Tr. formed between the adjoining MOS Trs. 32 increases. As a result, it becomes possible to suppress the parasitic action of the MOS Tr.

Further, the hydrogen at the interface between the semiconductor substrate 1 and the first silicon oxide film 15 in the bipolar Tr. 31 diffuses upward via the first silicon oxide film 15. Therefore, the dangling bonds at the above-mentioned interface increases and a current amplification factor (hFE) of the PNP parasitic bipolar Tr. comprising a base/collector/substrate in the NPN type bipolar Tr. 2 may be lowered.

Then, because the silicon nitride film 17 is formed in the one and same process with the dielectric film 17a of the capacitor element 33, it becomes possible to obtain the semiconductor device which allows the above-mentioned effects to be obtained by the same number of processing steps with the prior art semiconductor device comprising the bipolar Tr., the MOS Tr. and the capacitor element.

(Second Embodiment)

Figure 6:
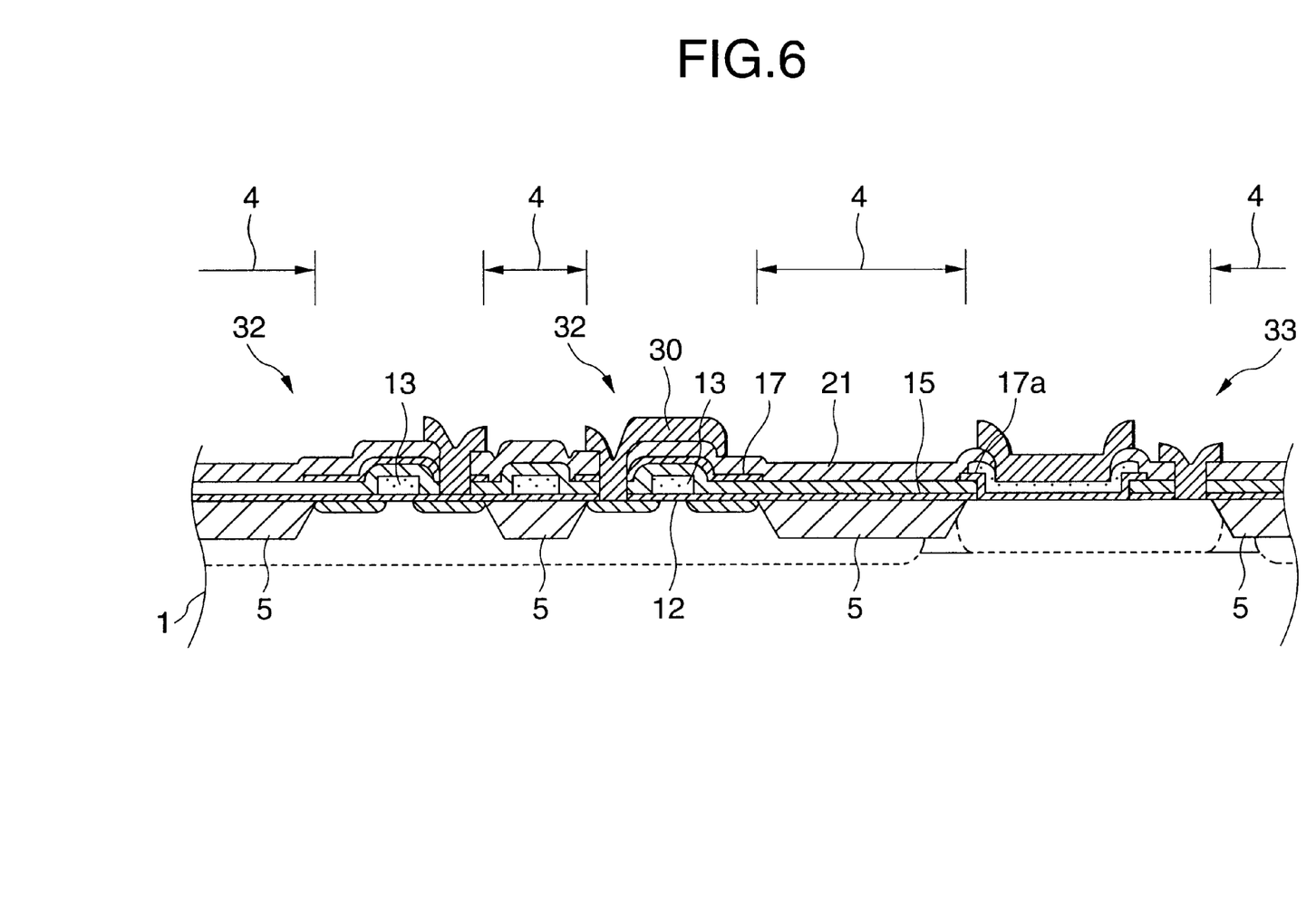
FIG. 6 is a section view showing the structure of a semiconductor device of a second embodiment.

FIG. 6 is a section view showing one structural example of the inventive semiconductor device. The semiconductor device shown in the figure is what the MOS Tr. 32 and the capacitor element 33 are provided on the surface side of the same semiconductor substrate 1. Then, similarly to the semiconductor device of the first embodiment, an insulating film covering the surface side of the semiconductor substrate 1 comprises the first silicon oxide film 15, the silicon nitride film 17 and the second silicon oxide film 21. In particular, the silicon nitride film 17 covers the MOS Tr. 32 and has an opening on the field oxide film 5 provided in the element isolating region 4. It also constitutes the dielectric film 17a in the capacitor element 33. The wires 30 having the same structure with that of the first embodiment are provided on the insulating film constructed as described above.

Such a semiconductor device also allows the same effects with the first embodiment to be obtained. In particular, the opening of the silicon nitride film 17 is provided on the element isolating region 4 for isolating the MOS Tr. 32. Therefore, the threshold voltage of the parasitic MOS between those MOS Trs. 32 is kept high, thus allowing prevention of a parasitic action from occurring.

It is noted that the procedure for manufacturing this semiconductor device is what the processing step for forming the bipolar Tr. is removed in the semiconductor device manufacturing method of the first embodiment.

Although the opening of the silicon nitride film 17 has been provided on the whole element isolating region 4 in each embodiment described above, it is possible to arrange so that an opening is provided also on the element isolating region 4 for isolating the MOS Trs. 32 and so that the silicon nitride film 17 covers the other element isolating region.

As described above, the threshold voltage of the MOS transistor may be stabilized, the hot-carrier resistance may be assured and the parasitic action may be suppressed even when the wire comprising the barrier metal made of the titanium material is provided by providing the silicon nitride insulating film covering the MOS transistor and having the opening above the element isolating region for isolating the MOS transistors above the semiconductor substrate.

Further, when the bipolar transistor is provided on the semiconductor substrate, it is possible to lower the current amplification factor (hFE) of the reverse conductive parasitic bipolar transistor comprising the base/collector/substrate in the bipolar transistor by providing the opening of the silicon nitride insulating film on the bipolar transistor.

Still more, it becomes possible to manufacture the semiconductor device which allows the above-mentioned effects to be obtained by the same number of processing steps with the conventional semiconductor device comprising the respective elements, thus allowing suppression of the production cost, by forming the silicon nitride insulating film by the same process with the dielectric film of the capacitor element.

The inventive semiconductor device manufacturing method also allows the semiconductor device comprising the silicon nitride insulating film covering the MOS transistors together with those respective elements and having the opening above the device isolating region (and above the bipolar transistor) to be obtained with the same number of manufacturing steps in forming the semiconductor device comprising the MOS transistors and the capacitor element (and the bipolar transistor).

While the preferred embodiments have been described, variations thereto will occur to those skilled in the art within the scope of the present inventive concepts which are delineated by the following claims.

What is claimed is:

1. A semiconductor device including a substrate comprising:
 a MOS transistor provided on one side of said substrate, said MOS transistor comprising:
  a gate oxide formed above said substrate;
  a gate electrode formed directly above said gate oxide film;
  a first silicon oxide insulating film disposed directly on said gate electrode;
  a silicon nitride insulating film disposed directly on said first silicon oxide insulating film;
  a second silicon oxide insulating disposed directly on said silicon nitride insulating film; and
  a barrier metal including a titanium material formed directly on said second silicon oxide insulating film, and said semiconductor device having an opening from which at least said silicon nitride insulating film is removed above substantially all of an element isolating region for isolating said MOS transistor.

2. The semiconductor device according to claim 1, further comprising a bipolar transistor formed on the other side of said substrate, and an opening from which said silicon nitride insulating film has been removed provided at an upper part of said bipolar transistor.

3. The semiconductor device according to claim 1, further comprising a capacitor element formed on the other side of said substrate and said silicon nitride insulating film functioning as a dielectric for said capacitor element.

4. The semiconductor device according to claim 2, further comprising a capacitor element, and said silicon nitride insulating film functioning as a dielectric for said capacitor element.

5. The semiconductor device according to claim 3, wherein said capacitor element is a MIS type capacitor element.

6. The semiconductor device according to claim 1, wherein said silicon nitride insulating film is a silicon nitride film and said silicon oxide insulating film is a silicon oxide film.

7. The semiconductor device according to claim 1, wherein said substrate contains a p-type semiconductor substrate having plane orientation of (100).

8. A semiconductor device including a substrate comprising:
 a MOS transistor provided on one side of said substrate; and
 a double poly-silicon bipolar transistor provided on the other side of said substrate, said bipolar transistor comprising:
  a semiconductor layer in which a base take-out electrode and an emitter take-out electrode are different, and
 said MOS transistor comprising:
  a gate oxide film formed above said substrate,
  a gate electrode formed directly above said gate oxide film,
  a first silicon oxide insulating film disposed directly on said gate electrode;
  a silicon nitride insulating film disposed directly on said first silicon oxide insulating film,
  a second silicon oxide insulating film disposed directly on said silicon nitride insulating film; and
  a barrier metal including titanium material formed directly above said second silicon oxide film; said semiconductor device having an opening from which at least said silicon nitride insulating film is removed above substantially all of an element isolating region for isolating said MOS transistor from said bipolar transistor.

9. The semiconductor device according to claim 8, wherein an opening from which said silicon nitride insulating film has been removed is provided at an upper part of said bipolar transistor.

10. The semiconductor device according to claim 9, further comprising a capacitor element and said silicon nitride insulating film functioning as a dielectric for said capacitor element.

11. The semiconductor device according to claim 10, wherein said capacitor element is a MIS type capacitor element.

12. The semiconductor device according to claim 8, wherein said silicon nitride insulating film is a silicon nitride film and said silicon oxide insulating film is a silicon oxide film.

13. The semiconductor device according to claim 8, wherein said substrate contains a p-type semiconductor substrate having plane orientation of (100).

* * * * *